United States Patent [19]

Wernlund

[11] Patent Number: 5,444,420
[45] Date of Patent: Aug. 22, 1995

[54] NUMERICALLY CONTROLLED PHASE LOCK LOOP SYNTHESIZER/MODULATOR AND METHOD

[75] Inventor: James V. Wernlund, Indialantic, Fla.

[73] Assignee: Harris Corporation, Melbourne, Fla.

[21] Appl. No.: 313,606

[22] Filed: Sep. 29, 1994

[51] Int. Cl.$^6$ .............. H03D 3/00; H03C 3/00; H03L 7/00; H03L 7/091
[52] U.S. Cl. ............... 331/1 R; 331/1 A; 331/11; 331/14; 331/16; 329/345; 327/2; 327/107; 455/260; 332/104
[58] Field of Search ............. 331/1 A, 1 R, 10, 11, 331/12, 14, 16, 17, 23, 25; 329/304, 306–308, 310, 345, 346; 455/260; 332/103, 104; 327/2, 105, 107

[56] References Cited

U.S. PATENT DOCUMENTS

| | | | |
|---|---|---|---|
| 3,593,182 | 7/1971 | Roelofs et al. | 331/23 |
| 4,313,209 | 1/1982 | Drucker | 331/23 X |
| 4,612,515 | 9/1986 | Ohkawa et al. | 331/1 A |
| 4,862,104 | 8/1989 | Muratani et al. | 331/17 X |
| 4,879,527 | 11/1989 | Geile et al. | 331/12 X |
| 5,235,622 | 8/1993 | Yoshida | 329/306 X |

Primary Examiner—David Mis
Attorney, Agent, or Firm—Rogers & Killeen

[57] ABSTRACT

A phase lock loop (PLL) circuit and method in which a PLL circuit locks on a variable input phase by providing an instantaneous phase value of a signal from an oscillator at periodic intervals, and by providing phase corrective signals to the oscillator at the same periodic intervals by comparing an instantaneous value of the variable phase to the corresponding instantaneous value of the oscillator signal phase, the phase corrective signals adjusting the phase of the oscillator signal to the predetermined phase. The PLL circuit may also lock on a predetermined frequency by providing frequency corrective signals until a difference between the predetermined frequency and the frequency of oscillator signal is smaller than a predetermined threshold.

16 Claims, 3 Drawing Sheets

`5,444,420`

NUMERICALLY CONTROLLED PHASE LOCK LOOP SYNTHESIZER/MODULATOR AND METHOD

BACKGROUND OF THE INVENTION

The present invention relates to phase lock loop (PLL) circuits and methods, and more particularly to a PLL circuit and method in which the lock point of the PLL is not fixed so that the phase between adjacent samples may be advanced a value from 0 to $2\pi$.

Conventional PLL circuits lock on a particular lock point that is fixed. The phase between adjacent samples can be advanced by a single value, $2\pi$. In synthesizers and modulators this limitation is desirably eliminated so that a PLL circuit lock point can be advanced in steps of from 0 to $2\pi$ without changing the reference frequency (RefClk), and so that the loop bandwidth ($B_{3dB}$), the natural frequency $\omega_n$, and the dampening $\zeta$ are independent of the output frequency (fout).

Present synthesizers and modulators employ techniques in which a conventional PLL circuit is phase locked to a direct digital synchronizer (DDS) either through a down conversion or a divide-by. The down conversion technique typically provides a narrow band PLL, while the divide-by technique has problems with phase noise multiplication. Neither technique provides the rapid acquisition and small step sizes that are desired in synthesizers and modulators, while maintaining low phase noise and large tuning ranges.

Accordingly, it is an object of the present invention to provide a novel PLL circuit and method that obviate the problems of the prior art.

It is another object of the present invention to provide a novel PLL circuit and method for a synthesizer/modulator in which the DDS is eliminated.

It is yet another object of the present invention to provide a novel PLL circuit and method for locking on a predetermined frequency and phase, the phase having a value from 0 to $2\pi$ that need not be constant.

It is still another object of the present invention to provide a novel PLL circuit and method for locking on a predetermined frequency and phase in which phase noise is reduced.

It is a further object of the present invention to provide a novel PLL circuit and method in which frequency and/or phase error corrective signals are averaged before being provided to an oscillator.

It is still a further object of the present invention to provide a novel phase detector for converting an analog signal from an oscillator to digital signals related to the phase of the analog signal.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

In an embodiment of the PLL circuit and method of the present invention, the PLL circuit locks on a input phase that may be variable by providing an instantaneous phase value of a signal from an oscillator at periodic intervals, and by providing phase corrective signals to the oscillator at the same periodic intervals by comparing an instantaneous value of the variable phase to the corresponding instantaneous value of the oscillator signal phase, the phase corrective signals adjusting the phase of the oscillator signal to the predetermined phase. The PLL circuit may also lock on a predetermined frequency by providing frequency corrective signals until a difference between the predetermined frequency and the frequency of oscillator signal is smaller than a predetermined threshold. The circuit may be used to generate FSK, PSK, and filtered MSK signals.

Figure 1:
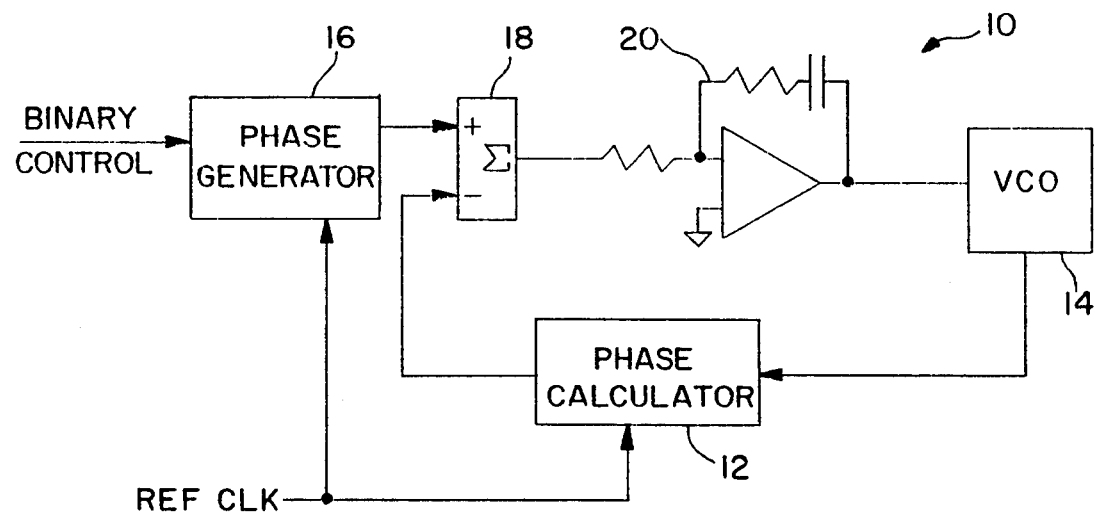
FIG. 1 is a block diagram of an embodiment of the present invention.

With reference now to FIG. 1, an embodiment 10 of the present invention may include a phase calculator 12 for determining the phase of a signal from a local oscillator 14 (that may, for example, be a voltage controlled oscillator, VCO), and a phase generator 16 for providing the desired phase responsive to a control signal input. At each transition of a reference signal RefClk (e.g., a rising or falling edge) the phase calculator 12 generates a digital signal representing the instantaneous phase of the oscillator 14, and the phase generator 16 generates a digital signal representing the desired instantaneous phase. These two instantaneous phase values are provided to a comparator 18 for comparing the two values and for providing an output representing the instantaneous error between the inputs. The output from the comparator 18 may be shifted from digital to analog and filtered in circuitry 20 before being provided to the oscillator 14. The oscillator 14 receives the error signal input and adjusts its phase responsively.

Figure 2:
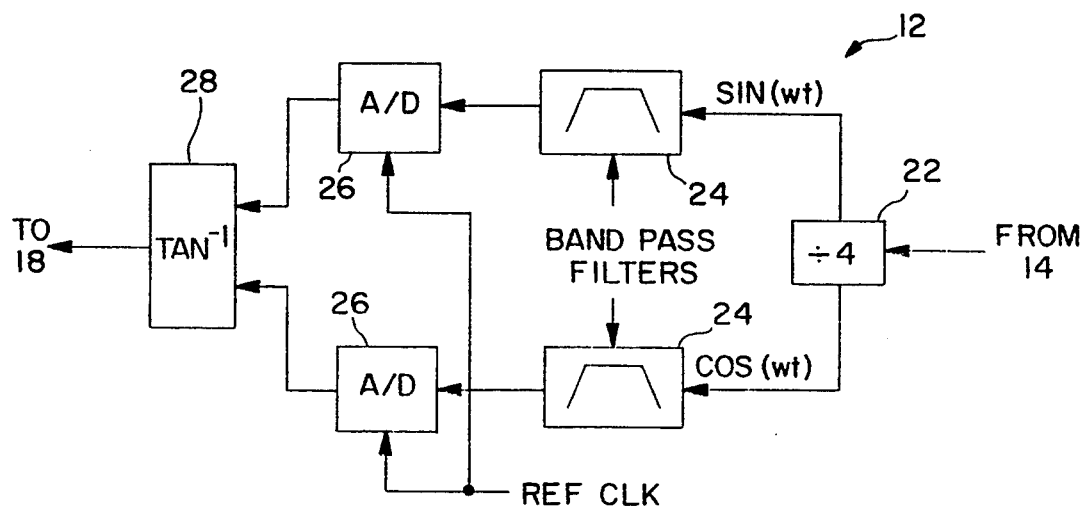
FIG. 2 is a block diagram of an embodiment of the phase calculator of FIG. 1.
Figure 3:
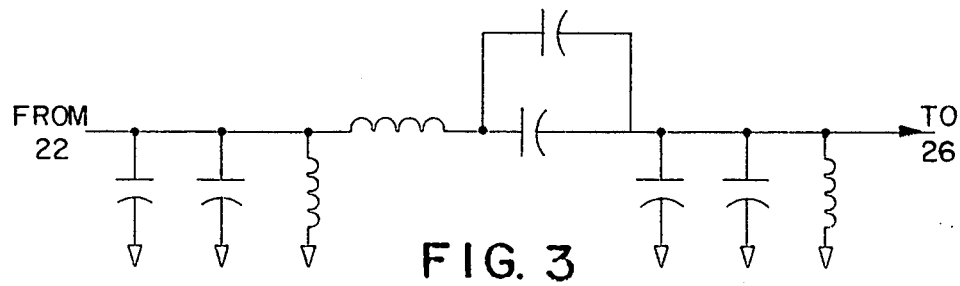
FIG. 3 is a circuit diagram of an embodiment of a band pass filter that may be used in the present invention.
Figure 4:
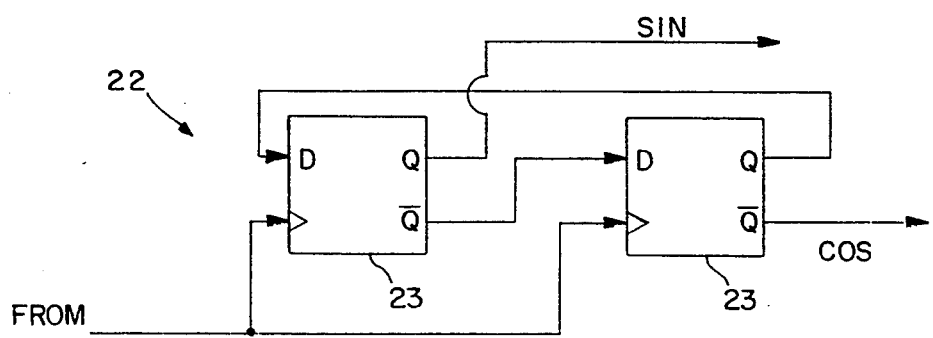
FIG. 4 is a circuit diagram of an embodiment of a divider that may be used in the present invention.

With reference now to FIG. 2, an embodiment of the phase calculator 12 of FIG. 1 may receive an analog signal from the oscillator 14 and use quadrature techniques to provide an instantaneous phase. The received signal may be divided by N (four in this example) in divider 22 to provide two square waves that are shifted 90° relative to each other (i.e., to provide the sine and cosine of the received signal.) The two square waves are filtered in band pass filters 24 that are preferably identical to isolate the fundamental components. The filters 24 desirably suppress harmonics of the square wave below the quantization floor of the analog-to-digital converters that are being used. On the transition of the reference signal, the two waves are sampled by analog-to-digital converters 26 to provide instantaneous sine and cosine samples. The instantaneous sine and cosine are provided to an arctangent converter 28 for providing the instantaneous phase angle of corresponding sampled sine and cosine. The converter 28 may be a PROM look-up table, or conventional calculating device. The use of square waves allows the circuit to operate over an octave. If wide band operation is not required, the divider 22 may be replaced with a quadrature hybrid. The phase calculator 12 will also find application as a linear phase detector. In a preferred embodiment the filters 24 are six element Butterworth band pass filters, such as illustrated in FIG. 3. A preferred embodiment of the divider 22 (for a divide by four) may include two flip-flops 23 as illustrated in FIG. 4.

Figure 5:
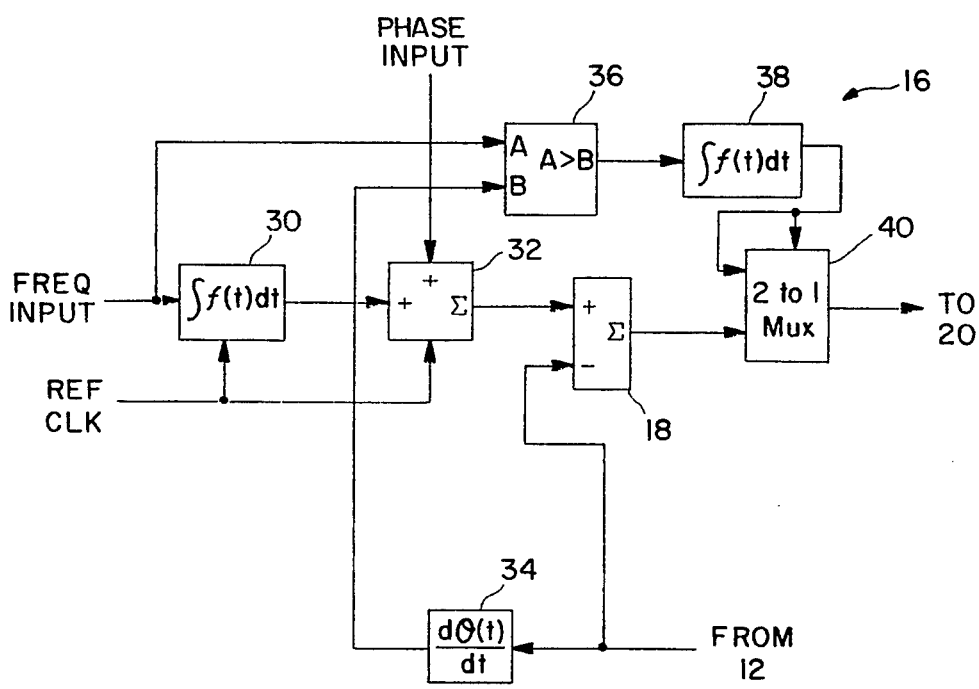
FIG. 5 is a block diagram of an embodiment of the phase generator and comparator of FIG. 1.

With reference now to FIG. 5, an embodiment of the phase generator 16 and comparator 18 of FIG. 1 may include an accumulator 30 for receiving a control signal that sets the desired operating frequency, and an adder 32 for receiving a phase input, such as when the circuit is being used to provide PSK data. Consecutive phase values from the phase calculator 12 are subtracted from each other in differentiator 34 to generate a frequency value (recall that the integral of frequency is phase, and that the differential of phase is frequency.) The generated frequency value is provided to a frequency comparator 36 where it is compared to the desired operating frequency. When the desired frequency is not the same as the generated frequency, a frequency error corrective signal is applied to the oscillator 14 to force the oscillator 14 to the desired frequency. The number of bits of data used to represent the frequency error determines how close the two frequencies will be, and with an eight bit system the frequency step size is (RefClk)/$2^8$. The output of the comparator 36 may be a one bit signal that is accumulated in averager 38 and compared to a threshold in multiplexer 40. If the accumulated value exceeds the threshold, the frequency error corrective signal overrides the phase error corrective signal. Once the frequency error is reduced below the threshold, the phase error correction overrides the frequency correction.

In a parallel path, the desired phase is provided by summing the phase from the accumulator 30 and the phase input in adder 32, and comparing the resultant desired phase with the phase from the phase calculator 12 in comparator 18. The comparator 18 provides a phase corrective signal to the oscillator 14. As with the frequency, the number of bits of data used to represent the phase error determines how close the two phases will be. The minimum size of the phase step available in the circuit is:

$$\text{minimum phase step} = \frac{(\text{RefClk freq}) \times N}{2^n} \quad (1)$$

where n is the length in number of bits of the accumulator 30, and N is the divide by number in divider 22 (four in this embodiment).

The accumulator 30 and adder 32 sample signals at the transition of the reference clock so that corresponding samples of the calculated and desired phases are generated at the same time.

Figure 6:
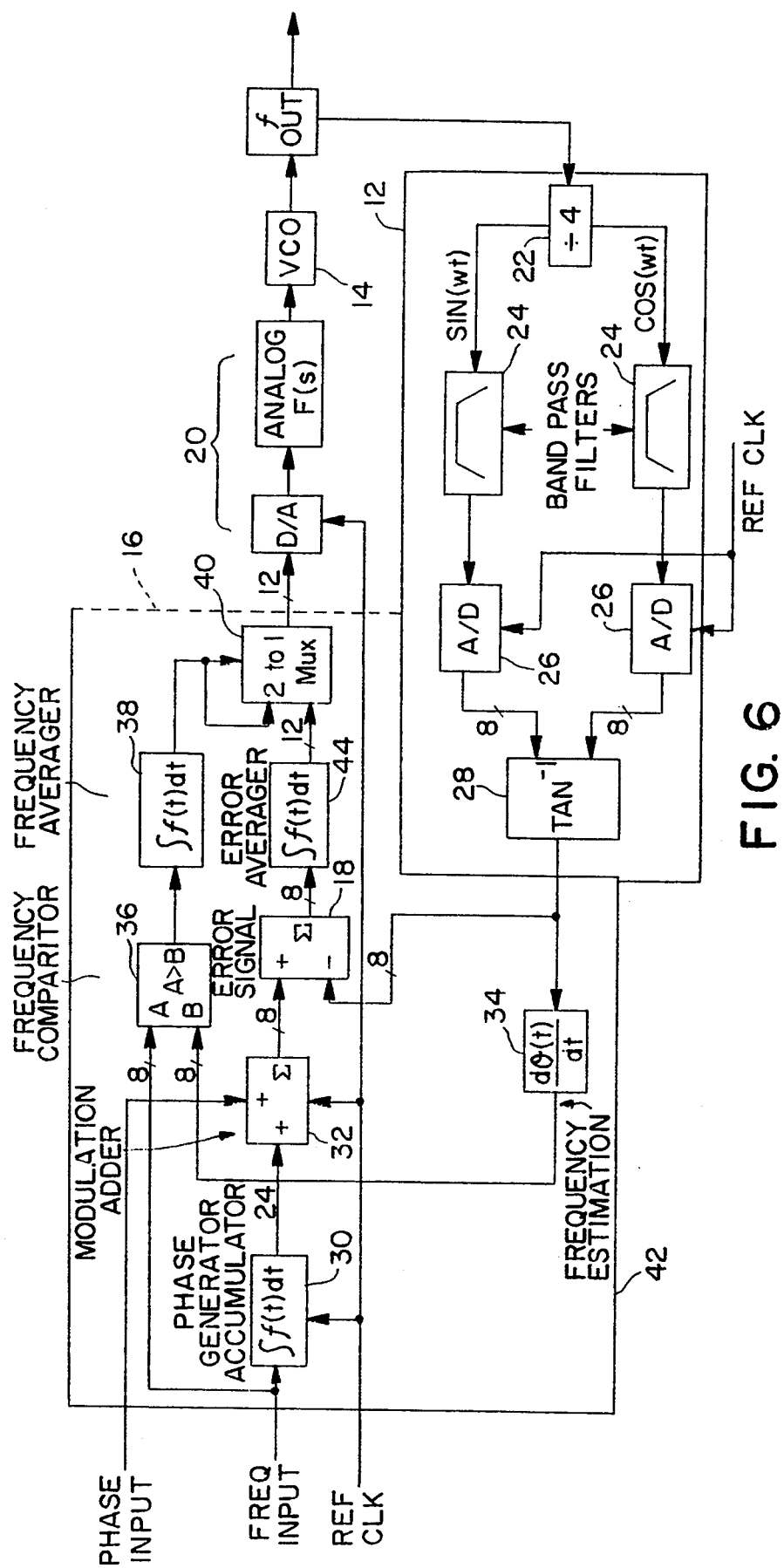
FIG. 6 is a block diagram of a further embodiment of the present invention.

With reference now to FIG. 6, a further embodiment of the invention may be used as a synthesizer/modulator able to produce CPFSK signals from 27 to 54 MHz. It can provide a carrier for modulation/demodulation that can hop in 25 KHz steps in this frequency range, and acquire the frequency in less than one microsecond. The oscillator 14 operates at 27-54 MHz, and the reference clock is 15 MHz. The numerical designation of similar elements from prior figures has been retained to assist in understanding FIG. 6. The phase generator 16 may be provided in a signle integrated circuit 42 (shown within the dashed lines) provided for a particular input and output. The integrated circuit 42 may be entirely digital (numbers of bits being shown on element connections) and may be tailored (e.g., blown) using conventional techniques.

In operation, the time needed to lock the PLL is the sum of the time it takes for the circuit to lock to the desired frequency and the time it takes for the circuit to lock to the desired phase. The frequency may be corrected first by accumulating a predetermined number (e.g., 256) of frequency error signals. If all the error signals are in the same direction, the frequency correction continues to drive the circuit. Once a frequency correction signal changes direction, the phase error most recently generated is used to drive the circuit. The circuit may be used to change the phase that is locked. For example, the circuit may be used to walk the phase periodically, such 89°, 90°, 91°, etc.

One of the objects of the invention is to reduce phase noise. The phase noise is determined, in part, by the response of the circuit to in-band spurious emissions. The quantization error of the phase calculator 12 sets in the in-band spurious emission response. The spurious emission response is reduced by 12 dB per octave beyond the 3 dB bandwidth of the circuit. In an eight bit system (as in the embodiment of FIG. 6), the spurious response is 55 dBc, assuming the one-half least significant bit error is uniformly distributed. In the embodiment of FIG. 6, an additional 12 dB is lost due to the divide by four. This sets the in-band spurious noise floor at 43 dBc.

An integrator 44 may be added to the embodiment of FIG. 6 after the comparator 18 to reduce the spurious emission response due to quantization (i.e., increase the accuracy of the measurement) by averaging the phase error. The error can be averaged over periods of time by reducing the update rate (number of corrective signals per time period) for the oscillator. The update rate can be reduced to about ten times the PLL circuit's bandwidth frequency without affecting PLL circuit performance. The increase in accuracy achievable by averaging the error is proportional to the square root of the sample size, m, where $$m = (\text{RefClk freq})/10 B_{3\,dB} \quad (2)$$

For the embodiment of FIG. 6, m=150, and the increase in accuracy is $(150)^{\frac{1}{2}}=12.2$. This increases in accuracy reduces the in-band spurious emissions by 21 dB, thereby setting the in-band spurious response for the embodiment of FIG. 6 to 64 dBc. This level will fall by 12 dB/octave from 10 KHz out. The resultant spurious emissions at 160 KHz is 112 dBc. While this increases the number of bits needed in the digital to analog converter in circuit 20 from eight to twelve, it also reduces the update rate to 100 KHz. For synthesizer applications, the PLL circuit bandwidth could be reduced to 1 KHz and the sample size increased to 1500, thereby reducing spurious emissions to 75 dBc, if the PLL circuit is not for providing MSK signals. In general, bandwidths less than about 1 KHz are not practical as they are unable to track microphonics.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A phase lock loop circuit for locking on a predetermined frequency and phase, the phase having a value from 0 to $2\pi$ that need not be constant, the circuit comprising:
   means for providing a phase of a signal from an oscillator at first periodic intervals; and
   means for providing corrective signals to said oscillator at said first intervals by comparing the predetermined phase to the oscillator signal phase, said corrective signals adjusting the frequency and the phase of the signal from said oscillator to the predetermined frequency and phase.

2. The circuit of claim 1 wherein said means for providing a phase comprises band pass filter means for filtering the sine and cosine of the signal from said oscillator.

3. The circuit of claim 2 wherein said means for providing a phase further comprises means for sampling the filtered sine and cosine signals at said first intervals.

4. The circuit of claim 1 wherein said means for providing corrective signals comprises a comparator for providing phase corrective signals.

5. The circuit of claim 4 further comprising means for averaging said phase corrective signals.

6. The circuit of claim 1 wherein said means for providing corrective signals comprises a discriminator for providing frequency corrective signals until a difference between the predetermined frequency and the frequency of the signal from said oscillator is smaller than a predetermined threshold, and for providing phase corrective signals thereafter.

7. The circuit of claim 6 further comprising means for averaging said frequency corrective signals.

8. A phase lock loop circuit that can lock from 0 to $2\pi$ comprising:
   a clock input;
   a voltage controlled oscillator (VCO);
   a linear phase detector for providing the phase of a signal from said VCO at a first transition of said clock input;
   a phase generator for providing a comparative phase at said first transition; and
   a combiner for providing a corrective signal to said VCO by combining the phase of the VCO and the comparative phase at said first transition.

9. The circuit of claim 8 wherein said linear phase detector is for providing band pass filtered sine and cosine signals related to the signal from said VCO, and for sampling the filtered sine and cosine signals at said first transition.

10. The circuit of claim 9 further comprising a memory for providing a phase from the sampled sine and cosine signals.

11. The circuit of claim 8 further comprising a discriminator for evaluating whether said VCO is to be corrected for frequency or phase error.

12. A phase detector for converting an analog signal from an oscillator to digital signals related to the phase of the analog signal, comprising:
   a quadrature converter for separating the analog signal into sine and cosine signals;
   a band pass filter for each of the sine and cosine signals;
   an analog to digital converter for each of the filtered sine and cosine signals; and
   a memory for providing digital signals related to the phase of the analog signal upon receipt of digitized sine and cosine signals.

13. A method of locking a phase lock loop (PLL) circuit on a variable phase, the method comprising the steps of:
   (a) providing an instantaneous phase value of a signal from an oscillator at first periodic intervals; and
   (b) providing phase corrective signals to the oscillator at the first intervals by comparing an instantaneous value of the variable phase to the corresponding instantaneous value of the oscillator signal phase, the phase corrective signals adjusting the phase of the oscillator signal to the predetermined phase.

14. The method of claim 13 wherein PLL circuit also locks on a predetermined frequency, and further comprising the steps of:
   (c) providing frequency corrective signals until a difference between the predetermined frequency and the frequency of oscillator signal is smaller than a predetermined threshold.

15. The method of claim 13 further comprising the step of averaging the phase corrective signals.

16. The method of claim 15 wherein the averaged phase corrective signals are provided to the oscillator at a rate that is not less than about ten times a bandwidth frequency of the PLL circuit.

* * * * *